(12) United States Patent
Kato et al.

(10) Patent No.: US 9,583,809 B2
(45) Date of Patent: Feb. 28, 2017

(54) HIGH-FREQUENCY SIGNAL LINE

(71) Applicant: Murata Manufacturing Co., Ltd., Nagaokakyo-shi, Kyoto-fu (JP)

(72) Inventors: Noboru Kato, Nagaokakyo (JP); Satoshi Ishino, Nagaokakyo (JP); Jun Sasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/509,285

(22) Filed: Oct. 8, 2014

(65) Prior Publication Data
US 2015/0022288 A1 Jan. 22, 2015

Related U.S. Application Data

(63) Continuation of application No. PCT/JP2013/066208, filed on Jun. 12, 2013.

(30) Foreign Application Priority Data

Jun. 29, 2012 (JP) ................................ 2012-147304

(51) Int. Cl.
*H01P 3/00* (2006.01)
*H01P 3/08* (2006.01)
(Continued)

(52) U.S. Cl.
CPC .............. *H01P 3/003* (2013.01); *H01P 3/026* (2013.01); *H01P 3/08* (2013.01); *H01P 3/082* (2013.01);
(Continued)

(58) Field of Classification Search
CPC .. H01P 3/003; H01P 3/026; H01P 3/08; H01P 3/082; H01P 3/085; H01P 5/028; H05K 1/0225
(Continued)

(56) References Cited

U.S. PATENT DOCUMENTS 5,057,798 A * 10/1991 Moye ...................... H01P 3/003
333/238
6,023,211 A 2/2000 Somei
(Continued)

FOREIGN PATENT DOCUMENTS

JP 05-183301 A 7/1993
JP 10-173410 A 6/1998
(Continued)

OTHER PUBLICATIONS

Official Communication issued in corresponding Japanese Patent Application No. 2014-522524, mailed on Feb. 24, 2015.
(Continued)

*Primary Examiner* — Stephen E Jones
*Assistant Examiner* — Scott S Outten
(74) *Attorney, Agent, or Firm* — Keating & Bennett, LLP

(57) ABSTRACT

A high-frequency signal line includes a body with a first layer level and a second layer level; a signal line including a first line portion provided at the first layer level, a second line portion provided at the second layer level, and a first interlayer connection connecting the first line portion and the second line portion; a first ground conductor including a first ground portion provided at the first layer level; a second ground conductor including a second ground portion provided at the second layer level; and a second interlayer connection connecting the first ground portion and the second ground portion. A distance between the first interlayer connection and the second interlayer connection is not less than a maximum distance between the first line portion and the first ground portion and is not less than a maximum distance between the second line portion and the second ground portion.

17 Claims, 9 Drawing Sheets

(51) Int. Cl.
*H01P 3/02* (2006.01)
*H01P 5/02* (2006.01)
*H05K 1/02* (2006.01)

(52) U.S. Cl.
CPC .............. *H01P 3/085* (2013.01); *H01P 5/028* (2013.01); *H05K 1/0225* (2013.01); *H05K 1/0251* (2013.01); *H05K 2201/097* (2013.01); *H05K 2201/09245* (2013.01); *H05K 2201/09336* (2013.01); *H05K 2201/09636* (2013.01)

(58) Field of Classification Search
USPC ........................................................ 333/238
See application file for complete search history.

(56) References Cited

U.S. PATENT DOCUMENTS

| | | | | |
|---|---|---|---|---|
| 6,369,324 B1* | 4/2002 | Tomie | ............... | H01L 23/66 174/541 |
| 6,493,861 B1* | 12/2002 | Li | .................. | H01F 17/0033 716/137 |
| 6,861,899 B2* | 3/2005 | Konishi | ............. | H05K 1/0231 327/565 |
| 8,031,033 B2* | 10/2011 | Mansell | ................ | H05K 1/165 333/140 |
| 2004/0150487 A1* | 8/2004 | Tabatabai | ............... | H01P 3/003 333/5 |
| 2004/0174228 A1* | 9/2004 | Kanno | .................. | H01L 23/66 333/34 |
| 2008/0100394 A1* | 5/2008 | Margomenos | .......... | H01P 1/047 333/32 |
| 2012/0133458 A1 | 5/2012 | Kato et al. | | |
| 2013/0207740 A1 | 8/2013 | Kato et al. | | |

FOREIGN PATENT DOCUMENTS

| | | |
|---|---|---|
| JP | 11-074396 A | 3/1999 |
| JP | 2000-068713 A | 3/2000 |
| JP | 2001-298306 A | 10/2001 |
| JP | 2014-42225 A | 3/2014 |
| WO | 2011/018934 A1 | 2/2011 |

OTHER PUBLICATIONS

Official Communication issued in International Patent Application No. PCT/JP2013/066208, mailed on Sep. 3, 2013.

\* cited by examiner

F I G. 5A
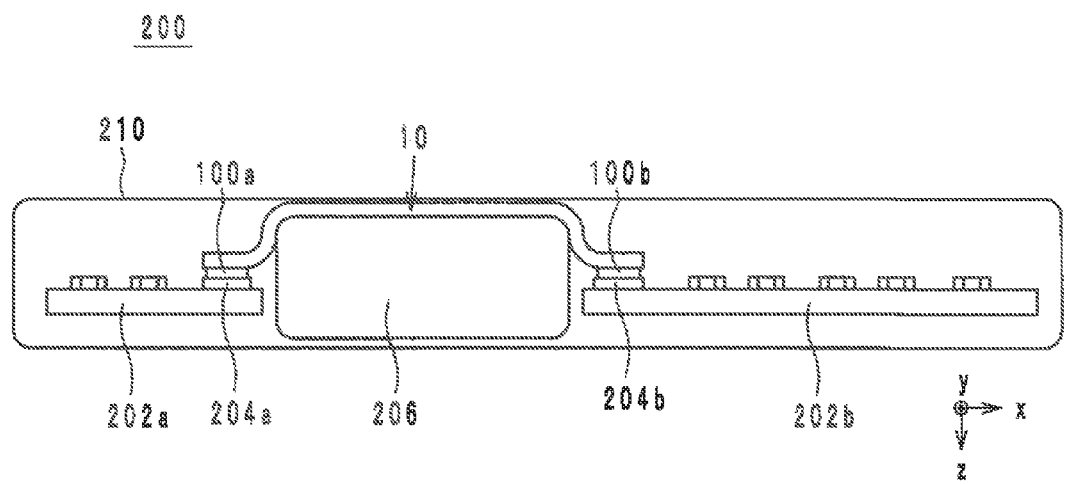
F I G. 5B
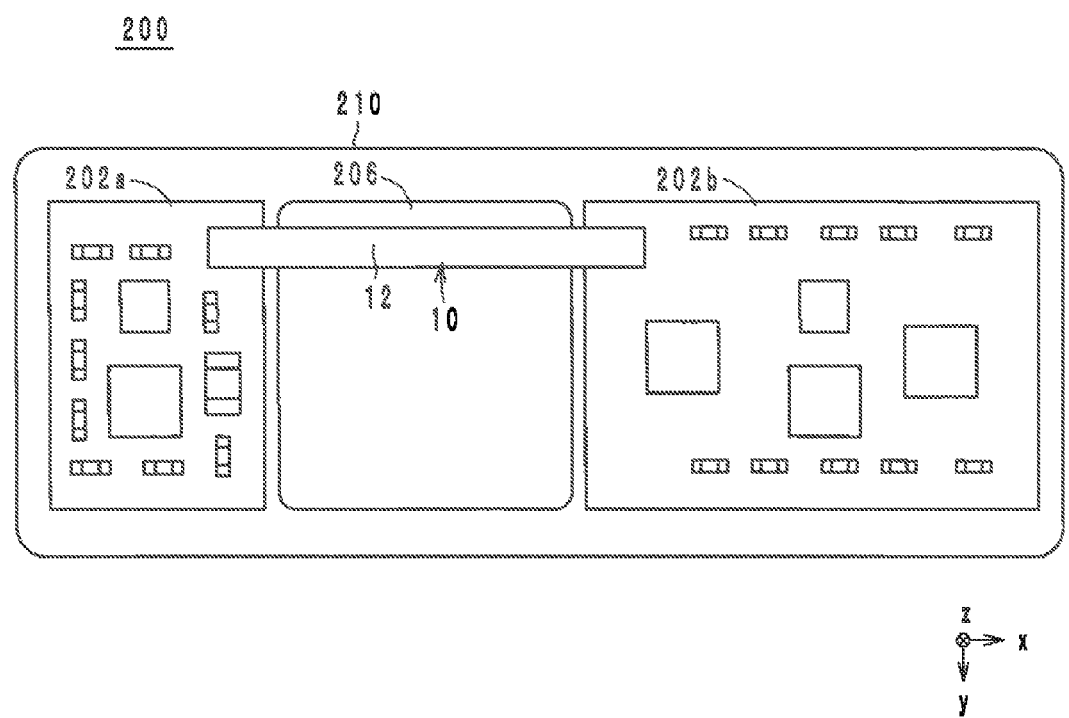

FIG. 9
PRIOR ART
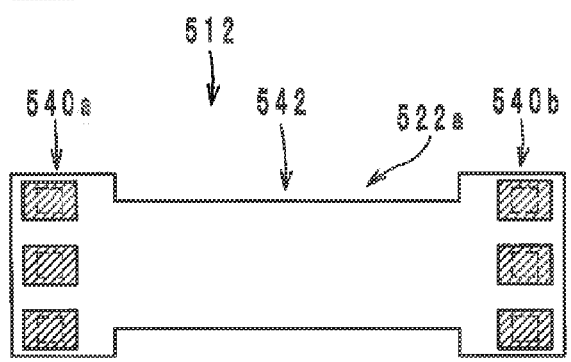
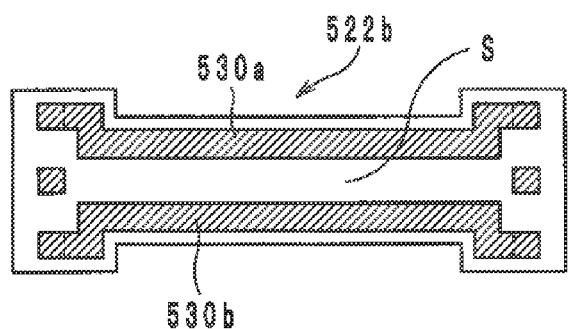
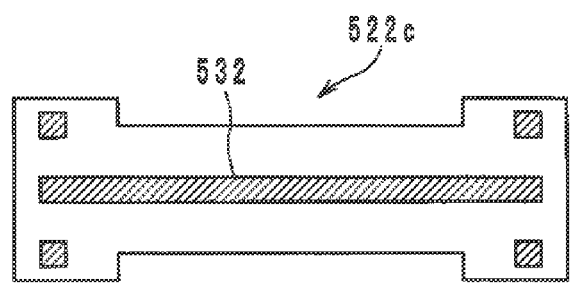
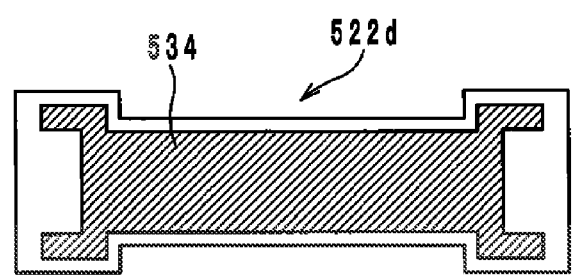

HIGH-FREQUENCY SIGNAL LINE

BACKGROUND OF THE INVENTION

1. Field of the Invention

The present invention relates to a high-frequency signal line, and more particularly to a high-frequency signal line preferably for use in high-frequency signal transmission.

2. Description of the Related Art

As a conventional high-frequency signal line, for example, a signal line disclosed in WO 2011/018934 is known. FIG. 9 is an exploded view of the signal line 500 disclosed in WO 2011/018934.

The signal line 500 illustrated in FIG. 9 includes a body 512, ground conductors 530a, 530b, 534, and a signal line 532. The body 512 is made by laminating insulating sheets 522a through 522d in this order.

The signal line 532 is provided on the insulating sheet 522c. The ground conductors 530a and 530b are provided on the insulating sheet 522b. The ground conductors 530a and 530b are located on opposite sides of a slit S. The slit S, when viewed from the direction of lamination, is located over the signal line 532. Accordingly, the ground conductors 530a and 530b are not opposed to the signal line 532.

The ground conductor 534 is provided on the insulating sheet 522d and is opposed to the signal line 532 with the insulating sheet 522c located therebetween.

In the signal line 500 having the structure described above, the ground conductors 530a and 530b are not opposed to the signal line 532, and there is little capacitance between each of the ground conductors 530a and 530b and the signal line 532. Therefore, a reduction in the distance in the direction of lamination between each of the ground conductors 530a and 530b and the signal line 532 is unlikely to cause too large an increase in the capacitance between each of the ground conductors 530a and 530b and the signal line 532, and is unlikely to result in a shift of the characteristic impedance of the signal line 532 from a desired value. Accordingly, with the structure of the signal line 500, it is possible to make the body 512 thinner.

In the signal line 500 disclosed in WO 2011/018934, however, relatively low-frequency noise is likely to occur as described below. In the following, both end portions of the signal line 500 are denoted by reference symbols 540a and 540b, and the portion of the signal line 500 between the end portions 540a and 540b is referred to as a line portion 542.

As is apparent from FIG. 9, the line portion 542 of the signal line 500 has a homogeneous cross-section structure. Accordingly, the characteristic impedance of the signal line 532 in the line portion 542 is constant. The end portions 540a and 540b are, for example, inserted in sockets of a circuit board. In this regard, both end portions of the signal line 532 are connected to terminals in the sockets, and parasitic impedance occurs in these connection portions. Moreover, the portions of the signal line 532 in the both end portions 540a and 540b are opposed to the conductors in the sockets, and parasitic capacitance is created between each of the parts of the signal line 532 in the end portions 540a and 540b and each of the conductors in the sockets. As a result, the characteristic impedance of the signal line 532 at the end portions 540a and 540b becomes different from the characteristic impedance of the signal line 532 at the line portion 542.

Then, when the characteristic impedance of the signal line 532 at the end portions 540a and 540b is different from the characteristic impedance of the signal line 532 at the line portion 542, reflection of a high-frequency signal occurs at the end portions 540a and 540b. This causes a low-frequency standing wave with a half wavelength equal or substantially equal to the distance between the end portions 540a and 540b. Consequently, low-frequency noise is radiated from the signal line 500.

SUMMARY OF THE INVENTION

Preferred embodiments of the present invention provide a high-frequency signal line capable of significantly diminishing or minimizing the risk of occurrence of low-frequency noise.

A high-frequency signal line according to a preferred embodiment of the present invention includes a body including a first layer level and a second layer level; a signal line including a first line portion provided at the first layer level, a second line portion provided at the second layer level, and a first interlayer connection connecting the first line portion and the second line portion to each other; a first ground conductor including a first ground portion provided at the first layer level to extend along the first line portion; a second ground conductor including a second ground portion provided at the second layer level to extend along the second line portion; and a second interlayer connection connecting the first ground portion and the second ground portion to each other. In the high-frequency signal line, a distance between the first interlayer connection and the second interlayer connection is not less than a maximum value of a distance between the first line portion and the first ground portion and is not less than a maximum value of a distance between the second line portion and the second ground portion.

Various preferred embodiments of the present invention reliably prevent the occurrence of low-frequency noise in a high-frequency signal line.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A and 5B are plan views in the y-direction and in the z-direction, respectively, of an electronic device including the high-frequency signal line.

FIG. 9 is an exploded view of a signal line disclosed in WO 2011/018934.

DETAILED DESCRIPTION OF THE PREFERRED EMBODIMENTS

High-frequency signal lines according to preferred embodiments of the present invention will be described with reference to the drawings.

Figure 1:
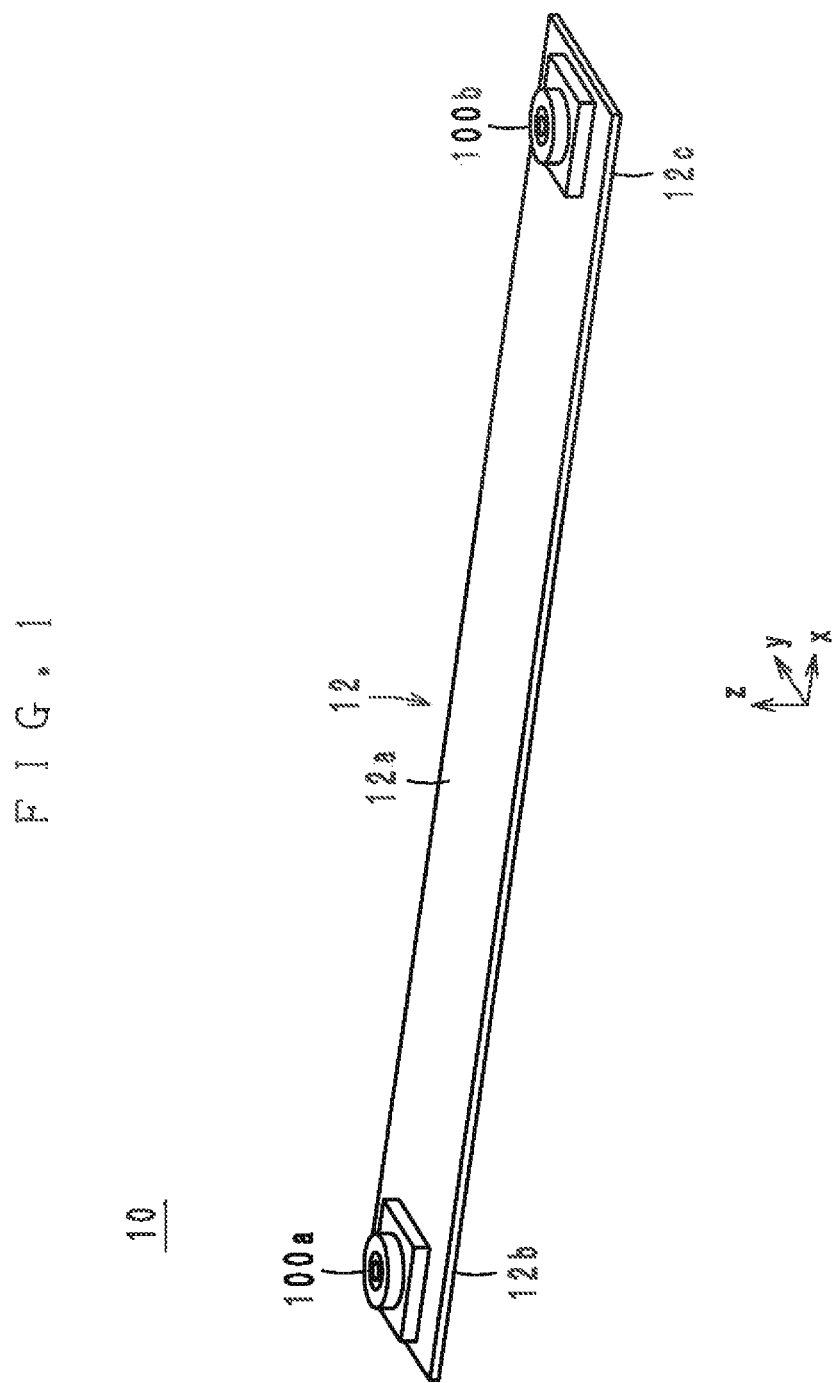
FIG. 1 is a perspective view of a high-frequency signal line according to a preferred embodiment of the present invention.
Figure 2:
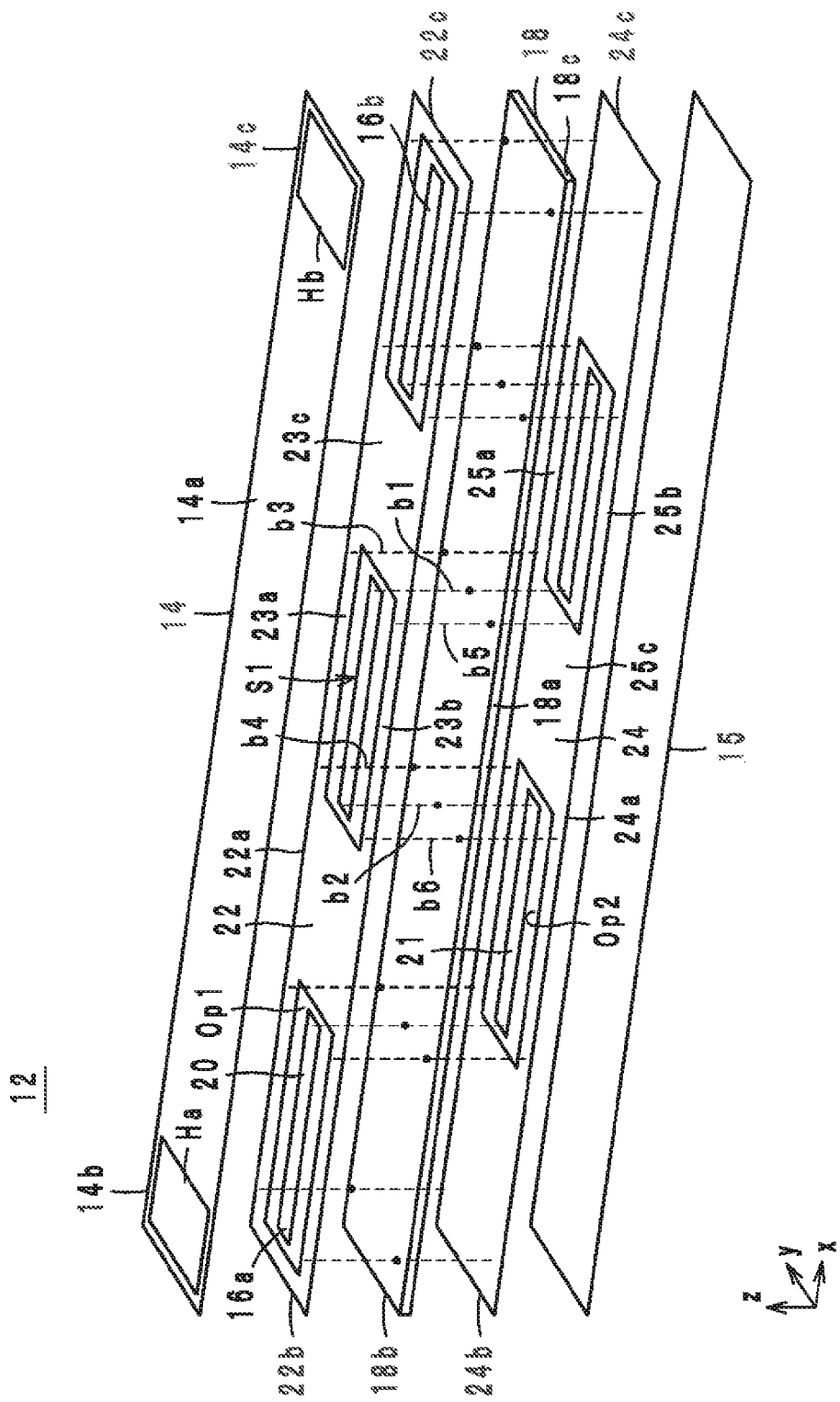
FIG. 2 is a dielectric element assembly of the high-frequency signal line according to a preferred embodiment of the present invention.
Figure 3:
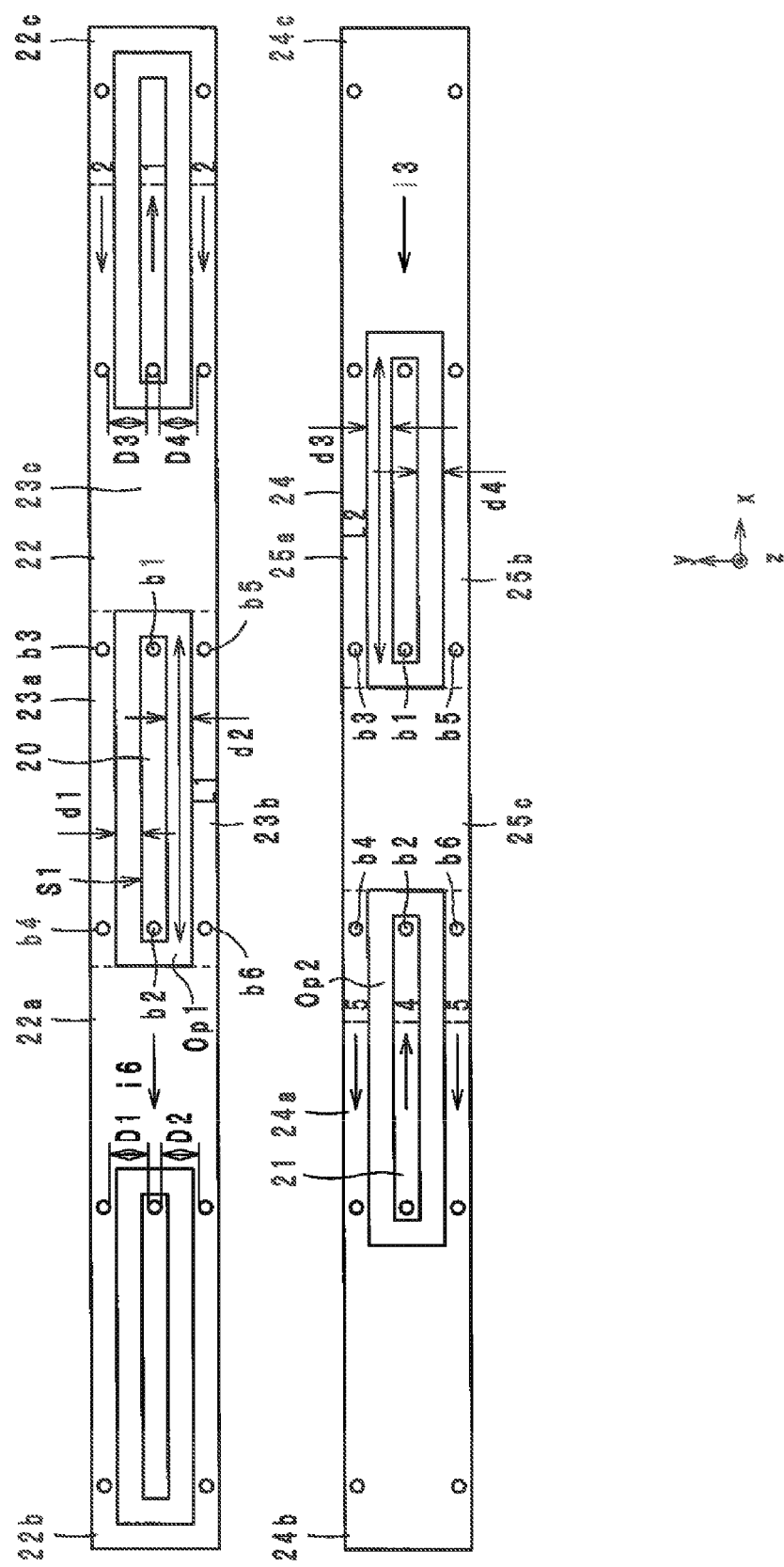
FIG. 3 indicates plan views of a signal line and ground conductors of the high-frequency signal line according to the first preferred embodiment of the present invention.

The structure of a high-frequency signal line according to a preferred embodiment of the present invention will be described with reference to the drawings. FIG. 1 is a perspective view of a high-frequency signal line 10 according to a preferred embodiment of the present invention. FIG. 2 is an exploded view of an element assembly of the high-frequency signal line 10 according to the present preferred embodiment. FIG. 3 indicates plan views of a signal line S1 and ground conductors 22 and 24 of the high-frequency signal line 10. In FIGS. 1 through 3, the direction of lamination of the high-frequency signal line 10 is defined as a z-direction. The lengthwise direction of the high-frequency signal line 10 is defined as an x-direction, and the direction perpendicular to the x-direction and the z-direction is defined as a y-direction.

The high-frequency signal line 10, as illustrated in FIGS. 1 through 3, preferably includes the dielectric element assembly (body) 12, a signal line 51, ground conductors 22 and 24, connectors 100a and 100b, and via-hole conductors b3 through b6.

As seen in FIG. 1, the dielectric element assembly 12 extends in the x-direction when viewed from the z-direction, and the dielectric element assembly 12 includes a line portion 12a, and connecting portions 12b and 12c. The dielectric element assembly 12 includes, as seen in FIG. 2, a flexible laminate body including a preventive layer 14, a dielectric sheet (sheet member) 18 and a preventive layer 15 laminated in this order from a positive side to a negative side in the z-direction. The main surface of the dielectric element assembly 12 located on the positive side in the z-direction will be hereinafter referred to as atop surface, and the main surface of the dielectric element assembly 12 located on the negative side in the z-direction will be hereinafter referred to as a bottom surface.

The line portion 12a extends in the x-direction. The connecting portion 12b preferably is a rectangular or substantially rectangular portion connected to an end of the line portion 12a on a negative side in the x-direction. The connecting portion 12c preferably is a rectangular or substantially rectangular portion connected to an end of the line portion 12a on a positive side in the x-direction. The widths (the sizes in the y-direction) of the connecting portions 12b and 12c preferably are equal or substantially equal to the width (the size in the y-direction) of the line portion 12a. Accordingly, the dielectric element assembly 12 preferably is rectangular or substantially rectangular when viewed from the z-direction.

The dielectric sheet 18, when viewed from the z-direction, extends in the x-direction and preferably has the same or substantially the same shape as the dielectric element assembly 12. The dielectric sheet 18 is preferably made of flexible thermoplastic resin, such as polyimide, liquid polymer or the like. The thickness of the dielectric sheet 18 preferably is, for example, about 200 μm. The main surface of the dielectric sheet 18 on the positive side in the z-direction will be hereinafter referred to as an upper surface, and the main surface of the dielectric sheet 18 on the negative side in the z-direction will be hereinafter referred to as a lower surface.

The dielectric sheet 18 includes a line portion 18a, and connecting portions 18b and 18c. The line portion 18a constitutes the line portion 12a. The connecting portion 18b constitutes the connecting portion 12b. The connecting portion 18c constitutes the connecting portion 12c.

The signal line S1 is, as indicated in FIG. 2, a linear conductor provided in the dielectric element assembly 12, and extends in the x-direction. The signal line S1 includes line portions 20 and 21, and via-hole conductors (interlayer connections) b1 and b2.

The line portions 20 (first line portions) are provided on the upper surface of the dielectric sheet 18 (at a first layer level) of the dielectric element assembly 12. The line portions 21 (second line portions) are provided on the lower surface of the dielectric sheet 18 (at a second layer level) of the dielectric element assembly 12.

As seen in FIGS. 2 and 3, the line portions (first line portions) 20 preferably are rectangular or substantially rectangular conductors provided on the upper surface of the line portion 18a of the dielectric sheet 18 to be arranged in the x-direction at uniform intervals. The line portions (second line portions) 21 preferably are rectangular or substantially rectangular conductors provided on the lower surface of the line portion 18a of the dielectric sheet 18 to be arranged in the x-direction at uniform intervals. The line portions 21 are in different positions in the x-direction from the line portions 20. When viewed from the z-direction, the respective end portions of the line portions 20 on the positive side in the x-direction are located over the respective end portions of the line portions 21 on the negative side in the x-direction. When viewed from the z-direction, the respective end portions of the line portions 20 on the negative side in the x-direction are located over the respective end portions of the line portions 21 on the positive side in the x-direction. Thus, the line portions 20 and 21 are arranged alternately in the x-direction.

However, the end portion on the negative side in the x-direction of the line portion 20 arranged at the most negative side in the x-direction is located on the upper surface of the connecting portion 18b, in the center thereof. The end portion on the positive side in the x-direction of the line portion 20 arranged at the most positive side in the x-direction is located on the upper surface of the connecting portion 18c, in the center thereof. The end portion on the negative side in the x-direction of the line portion 20 arranged at the most negative side in the x-direction and the end portion on the positive side in the x-direction of the line portion 20 arranged at the most positive side in the x-direction function as external terminals. The end portion on the negative side in the x-direction of the line portion 20 arranged at the most negative side in the x-direction and the end portion on the positive side in the x-direction of the line portion 20 arranged at the most positive side in the x-direction will be hereinafter referred to external terminals 16a and 16b, respectively. The external terminals 16a and 16b preferably are plated with gold, for example.

The lengths L1 (see FIG. 3) of the line portions 20 and the lengths L2 (see FIG. 3) of the line portions 21 are shorter than a half wavelength of a high-frequency signal to be transmitted through the signal line S1. The line portions 20 and 21 as thus far described are preferably made of a metal material with low specific resistance, for example, a silver-based, copper-based or aluminum-based material.

The via-hole conductors b1 (first interlayer connections) pierce the dielectric sheet 18 in the z-direction, thus connecting the upper surface of the dielectric sheet 18 and the lower surface of the dielectric sheet 18 to each other. The end of each of the via-hole conductors b1 on the positive side in the z-direction is connected to the end portion of each of the line portions 20 on the positive side in the x-direction. The end of each of the via-hole conductors b1 on the negative side in the z-direction is connected to the end portion of each of the line portions 21 on the negative side in the x-direction.

The via-hole conductors b2 (first interlayer connections) pierce the dielectric sheet 18 in the z-direction, thus connecting the upper surface of the dielectric sheet 18 and the lower surface of the dielectric sheet 18 to each other. The end of each of the via-hole conductors b2 on the positive side in the z-direction is connected to the end portion of each of the line portions 20 on the negative side in the x-direction. The end of each of the via-hole conductors b2 on the negative side in the z-direction is connected to the end portion of each of the line portions 21 on the positive side in the x-direction. The via-hole conductors b1 and b2 are preferably made of a metal material with low specific resistance, for example, a silver-based, copper-based or aluminum-based material. Alternatively, instead of the via-hole conductors b1 and b2, through holes, each including a conductive layer such as a solder layer on its inner surface, may be used, for example.

Thus, the signal line S1 preferably includes the line portions 20 and 21 connected alternately through the via-hole conductors b1 and b2. Accordingly, as can be seen from FIG. 2, the signal line S1, when viewed from the y-direction, extends in the x-direction in a zigzag manner (while oscillating in the z-direction).

The ground conductor 22 (first ground conductor) is, as indicated in FIGS. 2 and 3, provided on the upper surface of the dielectric sheet 18 where the line portions 20 are provided. When viewed from the z-direction (from the direction normal to the main surface of the body 12), the ground conductor 22 is arranged so as to cover the line portions 21 and not to cover the line portions 20. The ground conductor 22 is preferably made of a metal material with low specific resistance, for example, a silver-based, copper-based or aluminum-based material. In the following, the ground conductor 22 is described in more detail.

The ground conductor 22, as seen in FIG. 2, includes a line portion 22a, and terminal portions 22b and 22c. The line portion 22a is located on the upper surface of the line portion 18a, and extends in the x-direction. The line portion 22a, as seen in FIGS. 2 and 3, includes ground portions 23a through 23c.

The ground portions 23a (first ground portions) are provided on the upper surface of the line portion 18a, and each of the ground portions 23a is located on the positive side in the y-direction of each of the line portions 20 to extend along the adjacent line portion 20 in the x-direction. The ground portions 23b (third ground portions) are provided on the upper surface of the line portion 18a, and each of the ground portions 23b is located on the negative side in the y-direction of each of the line portions (that is, located on the opposite side of each of the line portions 20 from the ground portion 23a) to extend along the adjacent line portion 20 in the x-direction.

The ground portions 23c (fifth ground portions) are located between the line portions 20 and located over the line portions 21 when viewed from the z-direction. Each of the ground portions 23c is connected to the ground portions 23a and 23b located on both sides thereof in the x-direction. As a result, there are provided openings Op1, each enclosed by the ground portions 23a through 23c. Within each of the openings Op1, no ground conductor 22 is disposed. However, each of the line portions 20 is disposed within each of the openings Op1. Thus, each of the line portions 20 is enclosed by the ground conductor 22 while being insulated from the ground conductor 22. The line portion 22a of the ground conductor 22 preferably is, as indicated in FIG. 2, shaped like a ladder.

As seen in FIG. 2, the terminal portion 22b is provided on the upper surface of the connecting portion 18b, and preferably is rectangular U-shaped or substantially rectangular U-shaped to enclose the external terminal 16a. The terminal portion 22b is connected to the end of the line portion 22a on the negative side in the x-direction. The terminal portion 22c is provided on the upper surface of the connecting portion 18c, and preferably is rectangular U-shaped or substantially rectangular U-shaped to enclose the external terminal 16b. The terminal portion 22c is connected to the end of the line portion 22a on the positive side in the x-direction.

The ground conductor 24 (second ground conductor) is, as indicated in FIGS. 2 and 3, provided on the lower surface of the dielectric sheet 18 where the line portions 21 are provided. When viewed from the z-direction (from the direction normal to the main surface of the body 12), the ground conductor 24 is arranged so as to cover the line portions 20 and not to cover the line portions 21. The ground conductor 24 is preferably made of a metal material with low specific resistance, for example, a silver-based, copper-based or aluminum-based material. In the following, the ground conductor 24 is described in more detail.

The ground conductor 24, as indicated in FIG. 2, includes a line portion 24a, and terminal portions 24b and 24c. The line portion 24a is located on the lower surface of the line portion 18a, and extends in the x-direction. The line portion 24a, as seen in FIGS. 2 and 3, includes ground portions 25a through 25c.

The ground portions 25a (second ground portions) are provided on the lower surface of the line portion 18a, and each of the ground portions 25a is located on the positive side of each of the line portions 21 in the y-direction to extend along the adjacent line portion 21 in the x-direction. The ground portions 25b (fourth ground portions) are provided on the lower surface of the line portion 18a, and each of the ground portions 25b is located on the negative side of each of the line portions 21 in the y-direction (that is, located on the opposite side of the adjacent line portion 21 from the ground portion 25a) to extend along the adjacent line portion 21 in the x-direction.

The ground portions 25c (sixth ground portions) are located between the line portions 21 and located over the line portions 20 when viewed from the z-direction. The ground portions 25c are connected to the ground portions 25a and 25b located on both sides thereof in the x-direction. As a result, there are provided openings Op2, each enclosed by the ground portions 25a through 25c. Within each of the openings Op2, no ground conductor 24 is disposed. However, each of the line portions 21 is disposed within each of the openings Op2. Thus, each of the line portions 21 is enclosed by the ground conductor 24 while being insulated from the ground conductor 24. The line portion 24a of the ground conductor 24 is, as indicated in FIG. 2, shaped like a ladder.

As seen in FIG. 2, the terminal portion 24b is provided on the lower surface of the connecting portion 18b, and is continuous. The terminal portion 24b is connected to the end of the line portion 24a on the negative side in the x-direction. The terminal portion 24c is provided on the lower surface of the connecting portion 18c, and is continuous. The terminal portion 24c is connected to the end of the line portion 24a on the positive side in the x-direction.

The via-hole conductors b3 (second interlayer connections) pierce the line portion 18a of the dielectric sheet 18 in the z-direction. Each of the via-hole conductors b3 is located on the positive side in the y-direction of the end portion of each of the line portions 20 on the positive side in the x-direction. The end of each of the via-hole conductors b3 on the positive side in the z-direction is connected to each of the ground portions 23a of the ground conductor 22. The end of each of the via-hole conductors b3 on the negative side in the z-direction is connected to each of the ground portions 25a of the ground conductor 24.

The via-hole conductors b5 (third interlayer connections) pierce the line portion 18a of the dielectric sheet 18 in the z-direction. Each of the via-hole conductors b5 is located on the negative side in the y-direction of the end portion of each of the line portions 20 on the positive side in the x-direction. The end of each of the via-hole conductors b3 on the positive side in the z-direction is connected to each of the ground portions 23b of the ground conductor 22. The end of each of the via-hole conductors b5 on the negative side in the z-direction is connected to each of the ground portions 25b of the ground conductor 24.

As seen in FIGS. 2 and 3, one of the via-hole conductors b3, one of the via-hole conductors b1 and one of the via-hole conductors b5 are aligned in this order in the direction (y-direction) perpendicular to the direction in which the signal line S1 extends (x-direction). The via-hole conductors b3, b1and b5 extend in the z-direction in parallel or substantially in parallel with each other.

The via-hole conductors b4 pierce the line portion 18a of the dielectric sheet 18 in the z-direction. Each of the via-hole conductors b4 is located on the positive side in the y-direction of the end portion of each of the line portions 20 on the negative side in the x-direction. The end of each of the via-hole conductors b4 on the positive side in the z-direction is connected to each of the ground portions 23a of the ground conductor 22. The end of each of the via-hole conductors b4 on the negative side in the z-direction is connected to each of the ground portions 25a of the ground conductor 24.

The via-hole conductors b6 pierce the line portion 18a of the dielectric sheet 18 in the z-direction. Each of the via-hole conductors b6 is located on the negative side in the y-direction of the end portion of each of the line portions 20 on the negative side in the x-direction. The end of each of the via-hole conductors b6 on the positive side in the z-direction is connected to each of the ground portions 23b of the ground conductor 22. The end of each of the via-hole conductors b6 on the negative side in the z-direction is connected to each of the ground portions 25b of the ground conductor 24.

As seen in FIGS. 2 and 3, one of the via-hole conductors b4, one of the via-hole conductors b2 and one of the via-hole conductors b6 are aligned in this order in the direction (y-direction) perpendicular to the direction in which the signal line S1 extends (x-direction). The via-hole conductors b4, b2 and b6 extend in the z-direction in parallel or substantially in parallel with each other.

Now, the arrangements of the via-hole conductors b1 through b6 is described in more detail. The distance D1 between the via-hole conductors b1 and b3 in alignment with each other is greater than the maximum value of the distance d1 between each of the line portions 20 and the adjacent ground portion 23a. In the following, the distance between each of the line portions and the adjacent ground portion is the shortest distance between each of the line portions and the adjacent ground portion. Thus, the width of the space between each of the line portions 20 and the adjacent ground portion 23a is smaller than the distance D1. The distance D1 preferably is within a range of about 400 μm to about 800 μm, and the maximum value of the distance d1 preferably is within a range of about 200 μm to about 800 μm, for example.

The distance D1 between the via-hole conductors b1 and b3 is also greater than the maximum value of the distance d3 between each of the line portions 21 and the adjacent ground portion 25a. In other words, the width of the space between each of the line portions 21 and the adjacent ground portion 25a is smaller than the distance D1. The maximum value of the distance d3 preferably is within a range of about 200 μm to about 800 μm, for example.

The distance D2 between the via-hole conductors b1 and b5 in alignment with each other is greater than the maximum value of the distance d2 between each of the line portions 20 and the adjacent ground portion 23b. In other words, the width of the space between each of the line portions 20 and the adjacent ground portion 23b is smaller than the distance D2. The distance D2 preferably is within a range of about 400 μm to about 800 μm, and the maximum value of the distance d2 preferably is within a range of about 200 μm to about 800 μm, for example.

The distance D2 between the via-hole conductors b1 and b5 is also greater than the maximum value of the distance d4 between each of the line portions 21 and the adjacent ground portion 25b. In other words, the width of the space between each of the line portions 21 and the adjacent ground portion 25b is smaller than the distance D2. The maximum value of the distance d2 preferably is within a range of about 200 μm to about 800 μm, for example.

The distance D3 between the via-hole conductors b2 and b4 in alignment with each other is greater than the maximum value of the distance d1 between each of the line portions 20 and the adjacent ground portion 23a. In other words, the width of the space between each of the line portions 20 and the adjacent ground portion 23a is smaller than the distance D3. The distance D3 preferably is within a range of about 400 μm to about 800 μm, for example.

The distance D3 between the via-hole conductors b2 and b4 is also greater than the maximum value of the distance d3 between each of the line portions 21 and the adjacent ground portion 25a. In other words, the width of the space between each of the line portions 21 and the adjacent ground portion 25a is smaller than the distance D3. The maximum value of the distance d3 preferably is within a range of about 200 μm to about 800 μm, for example.

The distance D4 between the via-hole conductors b2 and b6 in alignment with each other is greater than the maximum value of the distance d2 between each of the line portions 20 and the adjacent ground portion 23b. In other words, the width of the space between each of the line portions 20 and the adjacent ground portion 23b is smaller than the distance D4. The distance D4 preferably is within a range of about 400 μm to about 800 μm, for example.

The distance D4 between the via-hole conductors b2 and b6 is also greater than the maximum value of the distance d4 between each of the line portions 21 and the adjacent ground portion 25b. In other words, the width of the space between each of the line portions 21 and the adjacent ground portion 25*b* is smaller than the distance D4.

The preventive layer 14 covers almost the entire upper surface of the dielectric sheet 18. Accordingly, the preventive layer 14 covers the ground conductor 22. The preventive layer 14 is preferably made of, for example, thermoplastic resin such as a resist material or the like.

The preventive layer 14, as seen in FIG. 2, includes a line portion 14*a*, and connecting portions 14*b* and 14*c*. The line portion 14*a* covers the entire upper surface of the line portion 18*a* of the dielectric sheet 18 and accordingly covers the line portion 22*a* of the ground conductor 22.

The connecting portion 14*b* is connected to the end of the line portion 14*a* on the negative side in the x-direction and is located over the upper surface of the connecting portion 18*b*. The connecting portion 14*b* includes an opening Ha. The opening Ha preferably is a rectangular or substantially rectangular opening located in or substantially in the center of the connecting portion 14*b*. The external terminal 16*a* and the terminal portion 22*b* are exposed to outside through the opening Ha. The terminal portion 22*b* exposed to outside through the opening Ha defines and functions as an external terminal.

The connecting portion 14*c* is connected to the end of the line portion 14*a* on the positive side in the x-direction and is located over the upper surface of the connecting portion 18*c*. The connecting portion 14*c* includes an opening Hb. The opening Hb preferably is a rectangular or substantially rectangular opening located in or substantially in the center of the connecting portion 14*c*. The external terminal 16*b* and the terminal portion 22*c* are exposed to outside through the opening Hb. The terminal portion 22*c* exposed to outside through the opening Hb functions as an external terminal.

Figure 4A:
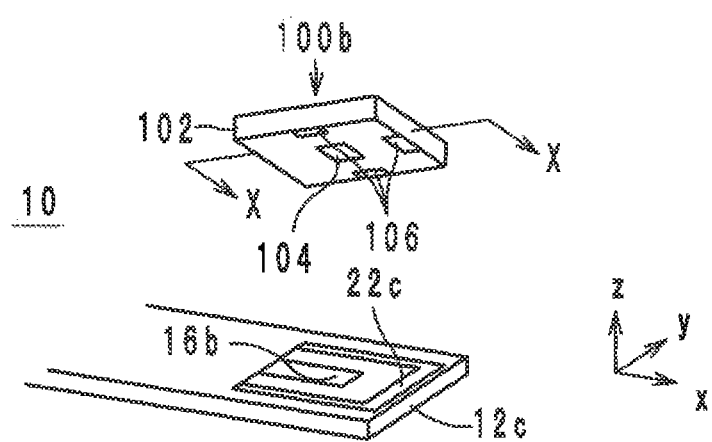
FIGS. 4A and 4B are a perspective view and a sectional view, respectively, of a connector of the high-frequency signal line.
Figure 4B:
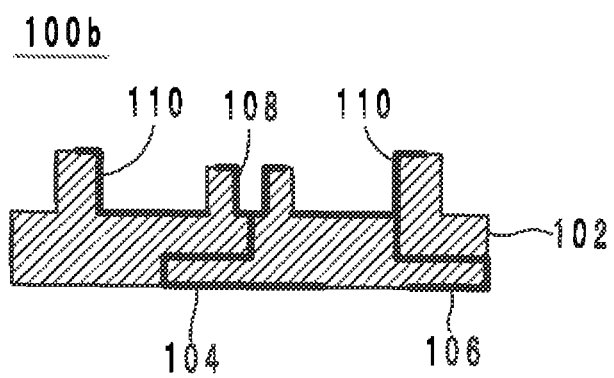

The connectors 100*a* and 100*b* are mounted on the top surfaces of the connecting portions 12*b* and 12*c*, respectively. The connectors 100*a* and 100*b* are electrically connected to the signal line S1 and the ground conductors 22 and 24. The connectors 100*a* and 100*b* preferably have the same structure, and in the following, the structure of the connector 100*b* is described as an example. FIGS. 4A and 4B are a perspective view and a sectional view, respectively, of the connector 100*b* of the high-frequency signal line 10.

The connector 100*b*, as seen in FIGS. 1, 4A and 4B, includes a connector body 102, external terminals 104 and 106, a central conductor 108 and an external conductor 110. The configuration of the connector body 102 preferably is a rectangular or substantially rectangular plate with a cylinder joined thereon, and the connector body 102 is preferably made of an insulating material such as resin.

The external terminal 104 is located on the surface of the connector body 102 on the negative side in the z-direction so as to face the external terminal 16*b*. The external terminal 106 is located on the surface of the connector body 102 on the negative side in the z-direction so as to face the terminal portion 22*c* exposed through the opening Hb.

The central conductor 108 is located in the center of the cylinder of the connector body 102 and connected to the external terminal 104. The central conductor 108 is a signal terminal configured to provide for input or output of a high-frequency signal to or from the signal line S1. The external conductor 110 is located in the inner surface of the cylinder of the connector body 102 and is connected to the external terminal 106. The external conductor 110 is a ground terminal of which potential is maintained at the ground potential.

The connector 100*b* having the structure described above is mounted on the upper surface of the connecting portion 12*c* such that the external terminal 104 is connected to the external terminal 16*b* and such that the external terminal 106 is connected to the terminal portion 22*c*. Thus, the signal line S1 is electrically connected to the central conductor 108, and the ground conductors 22 and 24 are electrically connected to the external conductor 110.

In the high-frequency signal line 10 having the structure described above, the characteristic impedance Z1 at the line portions 20 and 21 is different from the characteristic impedance Z2 at the via-hole conductors b1 and b2. More specifically, each of the line portions 20 is opposed to the ground conductor 24 and is adjacent to the ground conductor 22. Therefore, relatively great capacitance is created between each of the line portions 20 and the ground conductor 22 and between each of the line portions 20 and the ground conductor 24. Similarly, each of the line portions 21 is opposed to the ground conductor 22 and is adjacent to the ground conductor 24. Therefore, relatively great capacitance is created between each of the line portions 21 and the ground conductor 22 and between each of the line portions 21 and the ground conductor 24.

Each of the via-hole conductors b1, on the other hand, is not opposed to either the ground conductor 22 or the ground conductor 24. Therefore, only relatively small capacitance is created between each of the via-hole conductors b1 and the ground conductor 22 and between each of the via-hole conductors b1 and the ground conductor 24. Also, the distance D1 between the via-hole conductors b1 and b3 in alignment with each other is greater than the maximum value of the distance d1 between each of the line portions 20 and the adjacent ground portion 23*a* and greater than the maximum value of the distance d3 between each of the line portions 21 and the adjacent ground portion 25*a*. The distance D2 between the via-hole conductors b1 and b5 in alignment with each other is greater than the maximum value of the distance d2 between each of the line portions 20 and the adjacent ground portion 23*b* and greater than the maximum value of the distance d4 between each of the line portions 21 and the adjacent ground portion 25*b*. Therefore, only relatively small capacitance is created between the via-hole conductors b1 and b3 and between the via-hole conductors b1 and b5.

Further, each of the via-hole conductors b2 is not opposed to either the ground conductor 22 or the ground conductor 24. Therefore, only relatively small capacitance is created between each of the via-hole conductors b2 and the ground conductor 22 and between each of the via-hole conductors b2 and the ground conductor 24. Also, the distance D3 between the via-hole conductors b2 and b4 in alignment with each other is greater than the maximum value of the distance d1 between each of the line portions 20 and the adjacent ground portion 23*a* and greater than the maximum value of the distance d3 between each of the line portions 21 and the adjacent ground portion 25*a*. The distance D4 between the via-hole conductors b2 and b6 in alignment with each other is greater than the maximum value of the distance d2 between each of the line portions 20 and the adjacent ground portion 23*b* and greater than the maximum value of the distance d4 between each of the line portions 21 and the adjacent ground portion 25*b*. Therefore, only relatively small capacitance is created between the via-hole conductors b2 and b4 in alignment with each other and between the via-hole conductors b2 and b6 in alignment with each other.

Thus, the capacitance created around each of the line portions 20 and 21 is greater than the capacitance created around each of the via-hole conductors b1 and b2. Therefore, the characteristic impedance Z1 at the line portions 20 and 21 is smaller than the characteristic impedance Z2 at the via-hole conductors b1 and b2. The characteristic impedance Z1 is, for example, about 30Ω, and the characteristic impedance Z2 is, for example, about 70Ω. The characteristic impedance of the signal line S1 as a whole is, for example, about 50Ω.

In the high-frequency signal line 10, the characteristic impedance Z3 at the both ends of the signal line S1 (that is, at the external terminals 16a and 16b) is an intermediate value between the characteristic impedance Z1 at the line portions 20 and 21 and the characteristic impedance Z2 at the via-hole conductors b1 and b2.

The high-frequency signal line 10 preferably is used in the following exemplary way. FIGS. 5A and 5B are a plan view from the y-direction and a plan view from the z-direction, respectively, of an electronic device 200 including the high-frequency signal line 10.

The electronic device 200 includes the high-frequency signal line 10, circuit boards 202a and 202b, receptacles 204a and 204b, a battery pack (metal object) 206, and a case 210.

The battery pack 206 is, for example, a lithium-ion secondary battery, and the surface of the battery pack 206 is covered by a metal cover. The circuit board 202a, the battery pack 206 and the circuit board 202b are arranged in this order from the negative side to the positive side in the x-direction.

The top surface of the high-frequency signal line 10 (specifically, the preventive layer 14) contacts with the battery pack 206. The top surface of the high-frequency signal line 12 is fixed to the battery pack 206 by an adhesive or the like.

The receptacles 204a and 204b are located on respective main surfaces of the circuit boards 202a and 202b on the negative side in the z-direction. The connectors 100a and 100b are connected to the receptacles 204a and 204b respectively. As a result, a high-frequency signal having a frequency, for example, within a range of about 0.5 GHz to about 3.0 GHz to be transmitted between the circuit boards 202a and 202b is applied to the central conductors 108 of the connectors 100a and 100b through the receptacles 204a and 204b. The respective external terminals 110 of the connectors 100a and 100b are maintained at the ground potential through the circuit boards 202a and 202b, and the receptacles 204a and 204b. In this way, the high-frequency signal line 10 connects the circuit boards 202a and 202b to each other.

The main surface of the battery pack 206 on the negative side in the z-direction is on a different level from the receptacles 204a and 204b. Therefore, the both end portions of the line portion 12a of the dielectric element assembly 12 are bent such that the connectors 100a and 100b are connected to the receptacles 204a and 204b, respectively.

With reference to FIG. 2, a non-limiting example of a method of manufacturing the high-frequency signal line 10 is described below. In the following, a manufacturing method of one high-frequency signal line 10 is described as an example. Practically, however, by using a large-size dielectric sheet and cutting the sheet, a plurality of high-frequency signal lines are produced at one time.

First, a dielectric sheet formed of thermoplastic resin and including copper foils disposed entirely on the both main surfaces is prepared as the dielectric sheet 18. The surfaces of the copper foils on the dielectric sheet 18 are, for example, galvanized for corrosion prevention and thus are smoothened. The thicknesses of the copper foils preferably are within a range of about 10 µm to about 20 µm, for example.

Next, the line portions 20 and the ground conductor 22 as illustrated in FIG. 2 are formed on the upper surface of the dielectric sheet 18 by photolithography. Specifically, resists having identical shapes to the line portions 20 and the ground conductor 22 are printed on the copper foil on the upper surface of the dielectric sheet 18. Then, the copper foil is etched, so that the portions of the copper foil not covered by the resists are removed. Thereafter, the resists are removed. In this way, the line portions 20 and the ground conductor 22 as illustrated in FIG. 2 are formed on the upper surface of the dielectric sheet 18.

Next, the line portions 21 and the ground conductor 24 as illustrated in FIG. 2 are formed on the lower surface of the dielectric sheet 18 by photolithography. The photolithography process for forming the line portions 21 and the ground conductor 24 are preferably the same as the photolithography process for forming the line portions 20 and the ground conductor 22, and a description of the process is omitted here.

Next, the lower surface of the dielectric sheet 18 is exposed to laser beams such that through holes are made in the dielectric sheet 18 at the positions of the via-hole conductors b1 through b6. Thereafter, conductive paste is filled in the through holes made in the dielectric sheet 18, and thus, the via-hole conductors b1 through b6 are formed. It is not always necessary that the through holes for the via-hole conductors b1 through b6 are wholly filled with conductive paste, and for example, it may be sufficient to form conductors on the respective inner surfaces of the through holes.

Lastly, resin (resist) paste is applied to the upper surface and the lower surface of the dielectric sheet 18, and thus, the preventive layers 14 and 15 are formed.

In the high-frequency signal line 10 having the structure described above, low-frequency noise is reliably prevented. More specifically, in the signal line 500 disclosed in WO 2011/018934, the characteristic impedance of the signal line 532 at the end portions 540a and 540b is different from the characteristic impedance of the signal line 532 at the line portion 542, and reflection of a high-frequency signal occurs at the end portions 540a and 540b. This causes a low-frequency standing wave with a half wavelength equal or substantially equal to the distance between the end portions 540a and 540b, and consequently, low-frequency noise is radiated from the signal line 500.

In the high-frequency signal line 10, on the other hand, the characteristic impedance Z1 at the line portions 20 and 21 is different from the characteristic impedance Z2 at the via-hole conductors b1 and b2 as described above. More specifically, the characteristic impedance Z1 is lower than the characteristic impedance Z2. Therefore, the characteristic impedance of the signal line S1 changes cyclically between the impedance value Z1 and the impedance value Z2. This causes a standing wave with a half wavelength equal or substantially equal to the intervals between the via-hole conductors b1 and b2 (that is, each of the lengths L1 and L2 of the line portions 20 and 21), and thus, a high-frequency standing wave occurs. On the other hand, a standing wave with a long wavelength, more particularly, with a half wavelength equal or substantially equal to the distance between the external terminals 16a and 16b is unlikely to occur, that is, a low-frequency standing wave is unlikely to occur. In the high-frequency signal line 10, therefore, occurrence of low-frequency noise is reliably prevented.

In the high-frequency signal line 10, a standing wave with a half wavelength equal or substantially equal to the intervals between the via-hole conductors b1 and b2 occurs, and high-frequency noise occurs. By setting the intervals between the via-hole conductors b1 and b2 (that is, the lengths L1 and L2 of the line portions 20 and 21) to be sufficiently short, it is possible to set the frequency of the noise to be out of the band of a high-frequency signal to be transmitted through the signal line S1. To this end, it is preferable that the intervals between the via-hole conductors b1 and b2 (that is, the lengths L1 and L2 of the line portions 20 and 21) are smaller than the half wavelength of the high-frequency signal to be transmitted through the signal line S1.

In the high-frequency signal line 10, the characteristic impedance at the both ends of the signal line S1 is an intermediate value between the characteristic impedance Z1 at the line portions 20 and 21 and the characteristic impedance Z2 at the via-hole conductors b1 and b2. With this arrangement, in the high-frequency signal line 10, a standing wave with a short wavelength, that is, with a half wavelength equal or substantially equal to the intervals between the via-hole conductors b1 and b2 is likely to occur, and a standing wave with a long wavelength, that is, with a half wavelength equal or substantially equal to the distance between the ends of the signal line S1 is unlikely to occur. Thus, in the high-frequency signal line 10, occurrence of low-frequency noise is reliably prevented.

In the high-frequency signal line 10, also, it is possible to adjust the capacitance between each of the line portions 20 and the ground conductor 22 by adjusting the width of the space between each of the line portions 20 and the ground conductor 22. More specifically, by decreasing the width of the space between each of the line portions 20 and the ground conductor 22, larger capacitance is created between each of the line portions 20 and the ground conductor 22. On the other hand, by increasing the width of the space between each of the line portions 20 and the ground conductor 22, smaller capacitance is created between each of the line portions 20 and the ground conductor 22.

In the high-frequency signal line 10, also, a reduction in the width of the space between each of the line portions 20 and the ground conductor 22 allows for easy absorption of electrical lines of force radiated from each of the line portions 20 into the ground conductor 22. Thus, radiation of noise from the line portions 20 is reliably prevented.

Further, it is possible to make the high-frequency signal line 10 thinner as described below. When viewed from the z-direction, the openings Op1 are made in the ground conductor 22, and the line portions 20 are located inside the openings Op1. With this arrangement, the line portions 20 are not opposed to the ground conductor 22. Accordingly, only small capacitance is created between each of the line portions 20 and the ground conductor 22. Therefore, it is possible to design the distance between each of the line portions 20 and the ground conductor 22 to be shorter while maintaining the characteristic impedance at the line portions 20 at a predetermined value (for example, about 30Ω). In this preferred embodiment, the line portions 20 and the ground conductor 22 are preferably provided on the same dielectric sheet 18, for example. Consequently, the high-frequency signal line 10 is made thinner. When the high-frequency signal line 10 is made thinner, the high-frequency signal line 10 is configured to be easily bent.

Similarly, when viewed from the z-direction, the openings Op2 are made in the ground conductor 24, and the line portions 21 are located inside the openings Op2. With this arrangement, the line portions 21 are not opposed to the ground conductor 24. Accordingly, only small capacitance is created between each of the line portions 21 and the ground conductor 24. Therefore, it is possible to design the distance between each of the line portions 21 and the ground conductor 24 to be shorter while maintaining the characteristic impedance at the line portions 21 at a predetermined value (for example, about 30Ω). In this preferred embodiment, the line portions 21 and the ground conductor 24 are provided on the same dielectric sheet 18. Consequently, the high-frequency signal line 10 is made thinner. When the high-frequency signal line 10 is made thinner, the high-frequency signal line 10 is configured to be easily bent.

In the high-frequency signal line 10, also, leakage of magnetic fluxes therefrom is reliably prevented. When a current i1 (see FIG. 3) flows on the line portions 20, magnetic fluxes circle around the line portions 20 with the line portions 20 as the central axis. Leakage of such magnetic fluxes to outside from the high-frequency signal 10 may cause magnetic coupling between the line portions 20 and a signal line of another circuit. This makes it difficult to achieve desired characteristics of the high-frequency signal line 10.

In order to avoid this trouble, in the high-frequency signal line 10, the line portions 20 are located inside the openings Op1 of the ground conductor 22 and are also opposed to the ground conductor 24. Thus, the line portions 20 preferably are arranged near the ground conductors 22 and 24. When a current i1 flows on the line portions 20, a feedback current i2 flows on the ground conductor 22 in the opposite direction to the current i1, and a feedback current i3 flows on the ground conductor 24 in the opposite direction to the current i1. In this state, outside the high-frequency signal line 10, magnetic fluxes are offset by each other. As a result, the risk of leakage of magnetic fluxes to outside from the high-frequency signal line 10 is significantly diminished or minimized, and the risk of occurrence of noise is significantly diminished or minimized.

In the high-frequency signal line 10, further, the line portions 21 are located inside the openings Op2 of the ground conductor 24 and are also opposed to the ground conductor 22. Thus, the line portions 21 preferably are arranged near the ground conductors 22 and 24. When a current i4 flows on the line portions 21, a feedback current i5 flows on the ground conductor 24 in the opposite direction to the current i4, and a feedback current i5 flows on the ground conductor 22 in the opposite direction to the current i4. In this state, outside the high-frequency signal line 10, magnetic fluxes are offset by each other. As a result, the risk of leakage of magnetic fluxes to outside from the high-frequency signal line 10 is significantly diminished or minimized, and the risk of occurrence of noise is significantly diminished or minimized.

First Modification

Figure 6:
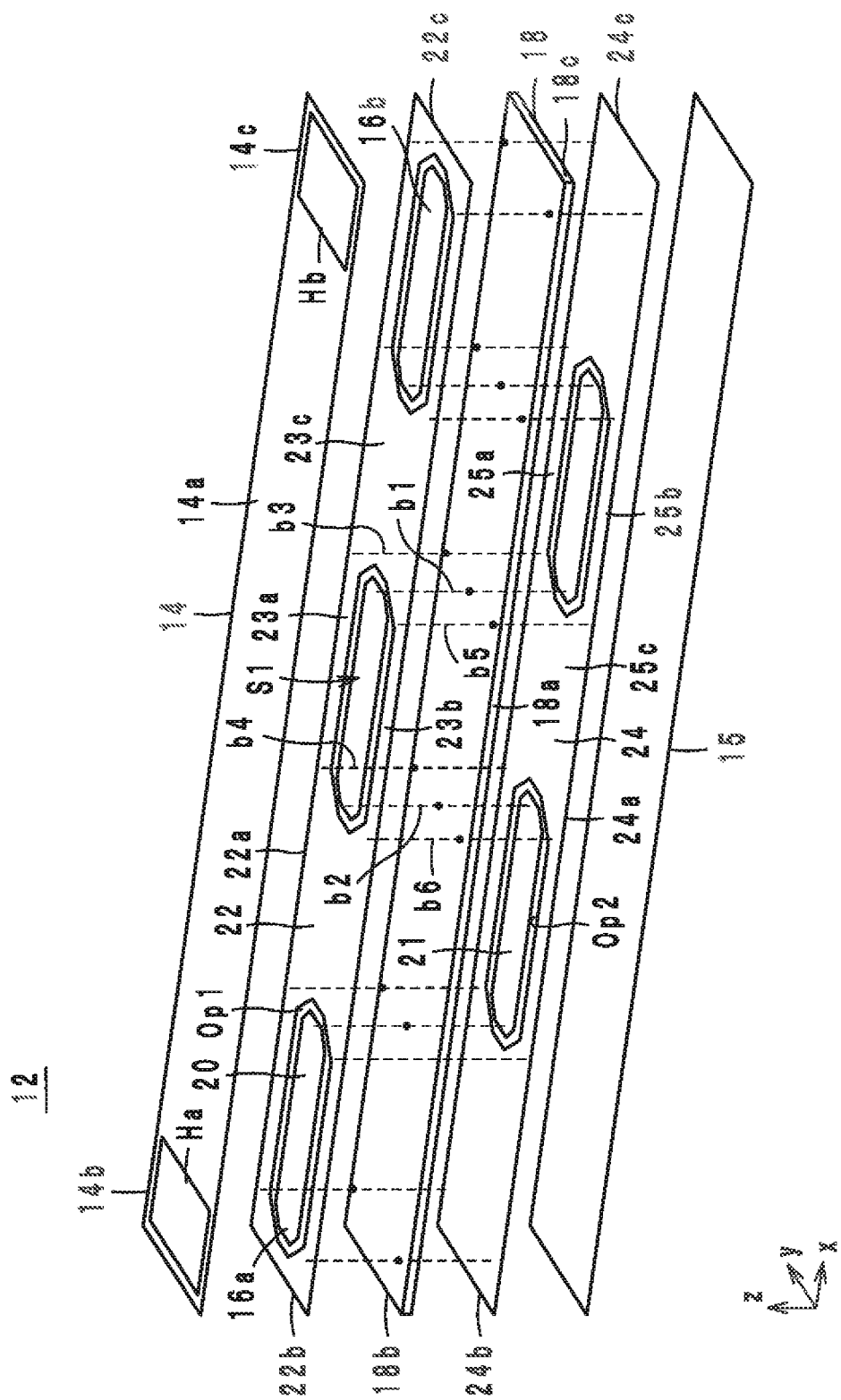
FIG. 6 is an exploded perspective view of a dielectric element assembly according to a first modification of a high-frequency signal line according to a preferred embodiment of the present invention.
Figure 7:
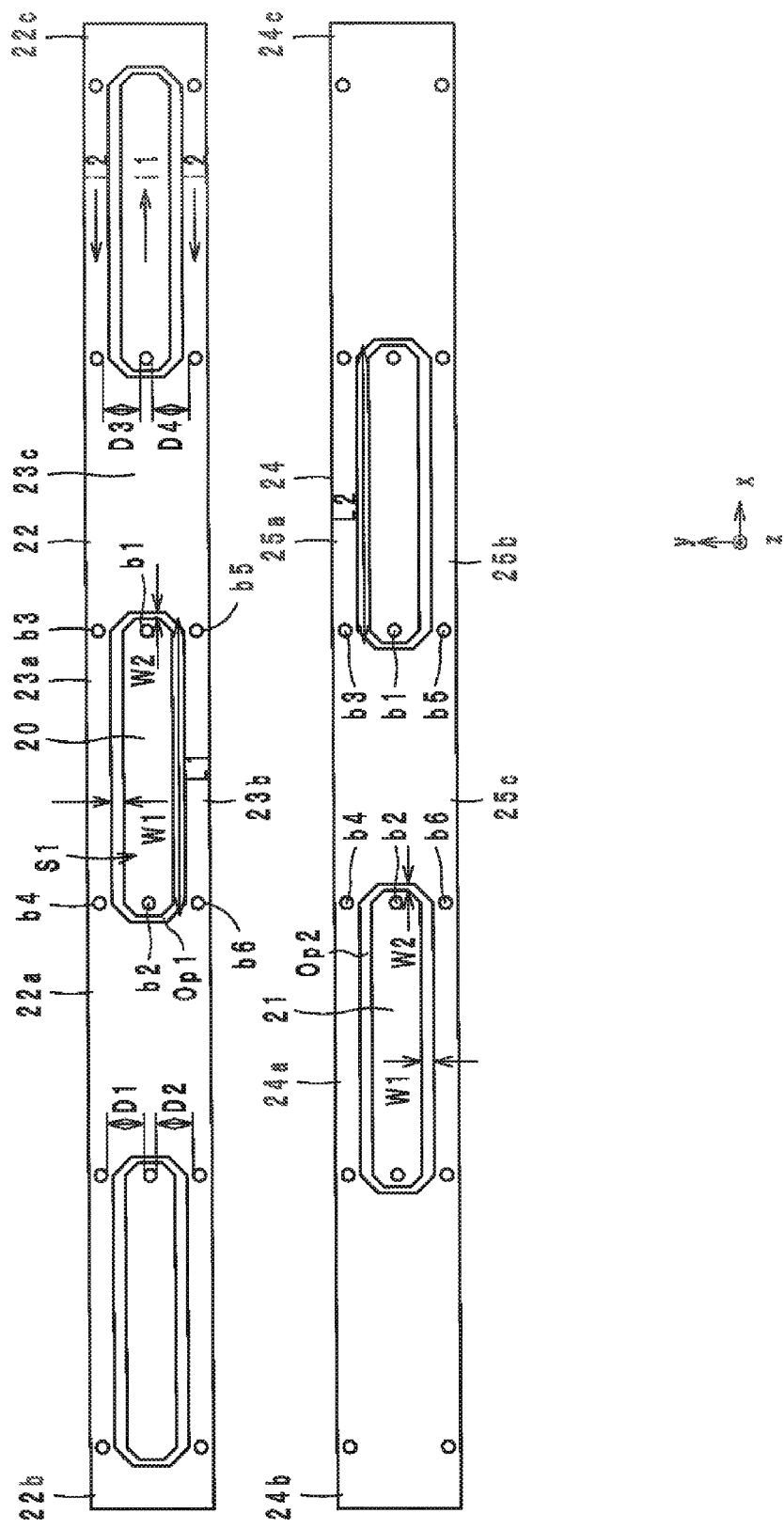
FIG. 7 indicates plan views of a signal line and ground conductors of the high-frequency signal line according to the first modification of a high-frequency signal line according to a preferred embodiment of the present invention.

Next, a high-frequency signal line 10a according to a first modification of a preferred embodiment of the present invention is described with reference to the drawings. FIG. 6 is an exploded perspective view of the element assembly 12 of the high-frequency signal line 10a. FIG. 7 indicates plan views of the signal line S1 and the ground conductors 22 and 24 of the high-frequency signal line 10a according to the first modification.

The high-frequency signal line 10a preferably is different from the high-frequency signal line 10 in the shapes of the line portions 20 and 21 and in the shapes of the openings Op1 and Op2. More specifically, as indicated in FIGS. 6 and 7, the both end portions in the x-direction of each of the line portions 20 and 21 are tapered. The both end portions in the x-direction of each of the openings Op1 and Op2 are tapered.

The width of the space between each of the line portions 20 and the ground conductor 22 becomes smaller with the decreasing distance from each of the ends in the x-direction. Specifically, in the central portion in the x-direction of each of the line portions 20, the width W1 of the space between each of the line portions 20 and the ground conductor 22 preferably is about 300 μm, for example. In the both end portions in the x-direction of each of the line portions 20, the width W2 of the space between each of the line portions 20 and the ground conductor 22 preferably is about 150 μm, for example.

Similarly, the width of the space between each of the line portions 21 and the ground conductor 24 becomes smaller with the decreasing distance from each of the ends in the x-direction. Specifically, in the central portion in the x-direction of each of the line portions 21, the width W1 of the space between each of the line portions 21 and the ground conductor 24 preferably is about 300 μm, for example. In the both end portions in the x-direction of each of the line portions 21, the width W2 of the space between each of the line portions 21 and the ground conductor 24 preferably is about 150 μm, for example.

In the high-frequency signal line 10a having the structure above, rapid changes of the characteristic impedance of the signal line S1 are reliably prevented. More specifically, the both ends of each of the line portions 20 are not opposed to the ground conductor 24. Accordingly, the capacitance between each of the ends in the x-direction of each of the line portions 20 and the ground conductor 24 is smaller than the capacitance between the central portion in the x-direction of each of the line portions 20 and the ground conductor 24. Therefore, the characteristic impedance at the both ends in the x-direction of each of the line portions 20 is greater than the characteristic impedance at the central portion in the x-direction of each of the line portions 20. For the same reason, the characteristic impedance at the both ends in the x-direction of each of the line portions 21 is greater than the characteristic impedance at the central portion in the x-direction of each of the line portions 21.

In order to prevent the changes in the characteristic impedance, in the high-frequency signal line 10a, the width of the space between each of the line portions 20 and the ground conductor 22 becomes smaller with the decreasing distance from each of the ends in the x-direction. Also, the width of the space between each of the line portions 21 and the ground conductor 24 becomes smaller with the decreasing distance from each of the ends in the x-direction. Accordingly, the capacitance between each of the both end portions in the x-direction of each of the line portions and the ground conductor 22 is larger. Similarly, the capacitance between each of the both end portions in the x-direction of each of the line portions 21 and the ground conductor 24 is larger. As a result, the characteristic impedance of the line portions 20 and 21 is reliably prevented from rapidly rising at the both end portions of the respective line portions 20 and 21.

Second Modification

Figure 8:
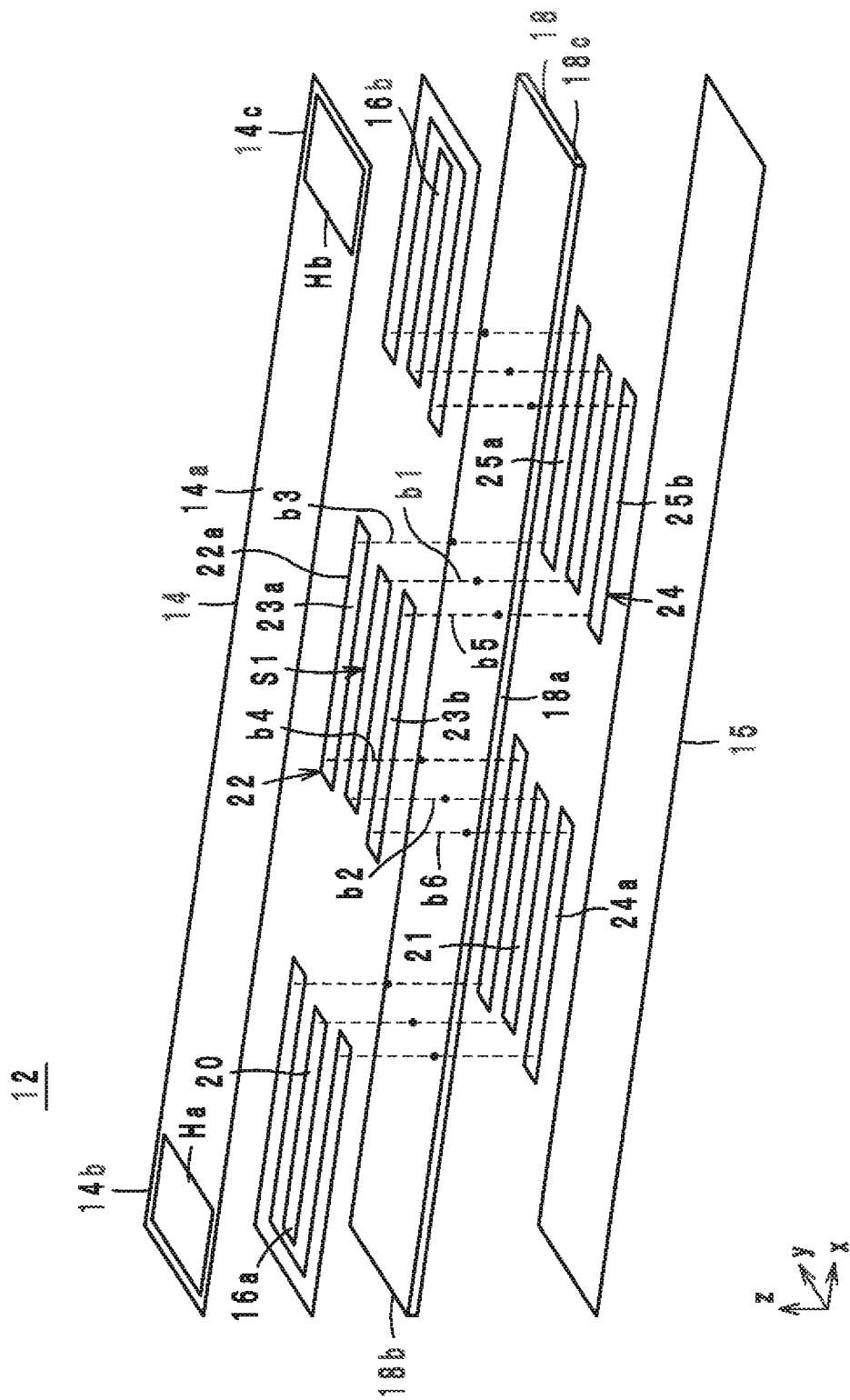
FIG. 8 is a dielectric element assembly according to a second modification of a high-frequency signal line according to a preferred embodiment of the present invention.

Next, a high-frequency signal line 10b according to a second modification of a preferred embodiment of the present invention is described with reference to the drawings. FIG. 8 is an exploded perspective view of the dielectric element assembly 12 of the high-frequency signal line 10b according to the second preferred embodiment.

The high-frequency signal line 10b preferably is different from the high-frequency signal line 10 in that the high-frequency signal line 10b does not have the ground portions 23c and 25c. Thus, the line portions 20 and the ground conductor 22 define a coplanar structure, and the line portions 21 and the ground conductor 24 define a coplanar structure. Also, the via-hole conductors b1, b3 and b5 in alignment with each other define a coplanar structure, and the via-hole conductors b2, b4 and b6 in alignment with each other define a coplanar structure.

The high-frequency signal line 10b having the structure above is capable of being bent more easily.

Other Preferred Embodiments

High-frequency signal lines according to the present invention are not limited to the high-frequency signal lines 10, 10a and 10b according to the preferred embodiments described above, and various changes and modifications may be possible within the scope of the present invention.

It is possible to combine the structures of the high-frequency signal lines 10, 10a and 10b, for example.

For connection between the high-frequency signal line 10, 10a or 10b and a circuit board or the like, any other member than the connectors 100a and 100b may be used. For example, connectors for flat cables, anisotropic conductive adhesive or the like may be used.

It is only necessary that the distance D1 between the via-hole conductors b1 and b3 in alignment with each other is not less than the maximum value of the distance d1 between each of the line portions 20 and the adjacent ground portion 23a and is not less than the maximum value of the distance d3 between each of the line portions 21 and the adjacent ground portion 25a. Accordingly, the distance D1 may be equal or substantially equal to the maximum value of the distance d1 and the maximum value of the distance d3. It is only necessary that the distance D2 between the via-hole conductors b1 and b5 in alignment with each other is not less than the maximum value of the distance d2 between each of the line portions 20 and the adjacent ground portion 23b and is not less than the maximum value of the distance d4 between each of the line portions 21 and the adjacent ground portion 25b. Accordingly, the distance D2 may be equal or substantially equal to the maximum value of the distance d2 and the maximum value of the distance d4. Similarly, it is only necessary that the distance D3 between the via-hole conductors b2 and b4 in alignment with each other is not less than the maximum value of the distance d1 between each of the line portions 20 and the adjacent ground portion 23a and is not less than the maximum value of the distance d3 between each of the line portions 21 and the adjacent ground portion 25a. Accordingly, the distance D3 may be equal or substantially equal to the maximum value of the distance d1 and the maximum value of the distance d3. It is only necessary that the distance D4 between the via-hole conductors b2 and b6 in alignment with each other is not less than the maximum value of the distance d2 between each of the line portions 20 and the adjacent ground portion 23b and is not less than the maximum value of the distance d4 between each of the line portions 21 and the adjacent ground portion 25b. Accordingly, the distance D4 may be equal or substantially equal to the maximum value of the distance d2 and the maximum value of the distance d4.

Various preferred embodiments of the present invention are useful in high-frequency signal lines, and various preferred embodiments of the present invention provide the advantage of preventing occurrence of low-frequency noise.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising a high-frequency signal line, the high-frequency signal line including:
    a body including a first layer level and a second layer level;
    a signal line including a plurality of first line portions provided at the first layer level, a plurality of second line portions provided at the second layer level, and a plurality of first interlayer connections connecting the plurality of first line portions and the plurality of second line portions to each other;
    a first ground conductor including a first ground portion provided at the first layer level and extending along the plurality of first line portions;
    a second ground conductor including a second ground portion provided at the second layer level and extending along the plurality of second line portions; and
    a second interlayer connection connecting the first ground portion and the second ground portion to each other; wherein
    a distance between each of the plurality of first interlayer connections and the second interlayer connection is not less than a maximum value of a distance between each of the plurality of first line portions and the first ground portion and is not less than a maximum value of a distance between each of the plurality of second line portions and the second ground portion such that a characteristic impedance of the plurality of first line portions and the plurality of second line portions is smaller than a characteristic impedance of the plurality of first interlayer connections and the second interlayer connection;
    intervals between the plurality of first interlayer connections are shorter than a half wavelength of a signal transmitted on the signal line;
    each of the plurality of first interlayer connections and the second interlayer connection includes a via-hole conductor; and
    a characteristic impedance at both ends of the high-frequency signal line is an intermediate value between (i) the characteristic impedance of the plurality of first line portions and the plurality of second line portions and (ii) a characteristic impedance of the via-hole conductors of the plurality of first interlayer connections and the second interlayer connection.

2. The electronic device according to claim 1, wherein the body is multilayer dielectric assembly including a dielectric sheet and preventive layers alternately arranged with each other.

3. The electronic device according to claim 2, wherein at least one of the preventive layers includes a line portion and connecting portions.

4. The electronic device according to claim 3, further comprising connectors mounted on top surfaces of the connecting portions and electrically connected to the signal line and the first and second ground conductors.

5. The electronic device according to claim 4, wherein each of the connectors includes a connector body, external terminals, a central conductor and an external conductor.

6. The electronic device according to claim 3, wherein at least one of the connecting portions includes an opening that is rectangular or substantially rectangular and located in or substantially in a center thereof so as to expose an external terminal.

7. The electronic device according to claim 3, wherein each of the plurality of first line portions and the plurality of second line portions is opposed to one of the first and second ground conductors and located adjacent to the other of the first and second ground conductors.

8. The electronic device according to claim 3, wherein each of the plurality of first interlayer connections and the second interlayer connection is not opposed to the first and second ground conductors.

9. The electronic device according to claim 2, wherein at least one of the preventive layers covers at least one of the first ground conductor and the second ground conductor.

10. The electronic device according to claim 1, wherein
    the first ground conductor further includes a third ground portion provided at the first layer level and located on an opposite side of the plurality of first line portions from the first ground portion to extend along the plurality of first line portions;
    the second ground conductor further includes a fourth ground portion provided at the second layer level and located on an opposite side of the plurality of second line portions from the second ground portion to extend along the plurality of second line portions;
    the high-frequency signal line further includes a third interlayer connection connecting the third ground portion and the fourth ground portion to each other; and
    a distance between each of the plurality of first interlayer connections and the third interlayer connection is not less than a maximum value of a distance between each of the plurality of first line portions and the third ground portion and is not less than a maximum value of a distance between each of the plurality of second line portions and the fourth ground portion.

11. The electronic device according to claim 10, wherein the plurality of first interlayer connections, the second interlayer connection and the third interlayer connection are aligned in a direction perpendicular or substantially perpendicular to a direction in which the signal line extends.

12. The electronic device according to claim 10, wherein the third interlayer connection includes one of a via-hole conductor and a conductive through hole.

13. The electronic device according to claim 1, wherein the plurality of first line portions and the plurality of second line portions are arranged alternately.

14. The electronic device according to claim 13, wherein the plurality of first line portions and the plurality of second line portions are connected alternately and configured such that the signal line extends in a zigzag manner.

15. The electronic device according to claim 1, wherein
    the first ground conductor further includes a fifth ground portion located over the plurality of second line portions when viewed from a direction normal to a main surface of the body; and
    the second ground conductor further includes a sixth ground portion located over the plurality of first line portions when viewed from a direction normal to the main surface of the body.

16. The electronic device according to claim 1, wherein
    the body includes a sheet member;
    the first layer level is an upper surface of the sheet member; and
    the second layer level is a lower surface of the sheet member.

17. The electronic device according to claim 1, wherein each of the first ground conductor and the second ground conductor include a line portion and terminal portions.

* * * * *